United States Patent
Uchida

(10) Patent No.: US 8,232,875 B2
(45) Date of Patent: Jul. 31, 2012

(54) SYSTEM AND METHOD FOR DISPLAYING DEGRADATION OF POWER STORAGE DEVICE

(75) Inventor: Masatoshi Uchida, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 594 days.

(21) Appl. No.: 12/490,603

(22) Filed: Jun. 24, 2009

(65) Prior Publication Data

US 2010/0007481 A1    Jan. 14, 2010

(30) Foreign Application Priority Data

Jul. 11, 2008 (JP) ................................. 2008-181524

(51) Int. Cl.
*B60Q 1/00* (2006.01)
*G08B 21/00* (2006.01)
*H02J 7/00* (2006.01)
*B60L 9/00* (2006.01)

(52) U.S. Cl. ... 340/455; 340/461; 340/525; 340/636.19; 340/691.6; 701/22; 320/104; 320/109; 320/134; 903/903; 903/907

(58) Field of Classification Search .................. 340/455, 340/636.19; 701/22; 320/109
See application file for complete search history.

(56) References Cited

U.S. PATENT DOCUMENTS

| 7,227,335 B2 * | 6/2007 | Sakakibara et al. ......... 320/132 |
| 2003/0137277 A1 | 7/2003 | Mori et al. |
| 2009/0040033 A1 | 2/2009 | Uchida |
| 2009/0326749 A1 | 12/2009 | Uchida |

FOREIGN PATENT DOCUMENTS

| DE | 112007000756 A1 | 2/2009 |
| EP | 1 261 064 A1 | 11/2002 |
| EP | 2 065 718 A1 | 6/2009 |
| JP | 5227669 | 9/1993 |
| JP | 2007274806 A | 10/2007 |
| JP | 2008083022 A | 4/2008 |
| JP | 2008116208 A | 5/2008 |

OTHER PUBLICATIONS

Office Action dated Feb. 6, 2012 from corresponding German Application No. 10 2009 027 595.9 with English translation; 8 pgs.

* cited by examiner

*Primary Examiner* — Donnie Crosland
(74) *Attorney, Agent, or Firm* — Gifford, Krass, Sprinkle, Anderson & Citkowski, P.C.

(57) ABSTRACT

A degradation evaluating unit collects data related to a power storage device from a vehicle through a power cable, and based on the collected data, evaluates the state of degradation of the power storage device. A data processing unit reads data related to the state of degradation of the power storage device evaluated by degradation evaluating unit from a storage unit, and processes the read data related to the state of degradation to a first display item for a user, a second display item for a dealer and a third display item for a manufacturer. A display control unit controls display of the data processed by data processing unit on a display terminal.

8 Claims, 12 Drawing Sheets

FIG.8

```
BATTERY LIFE IMPROVEMENT INFORMATION
                    ⟨CURRENT⟩  ⟨AFTER      ⟩  ⟨LIFE     ⟩
                    ⟨STATUS ⟩  ⟨IMPROVEMENT⟩  ⟨EXTENSION⟩

·BRAKING              ○%/S  →  ○%/S           ○Hr

·EXTERNAL
 CHARGING TIME        ○Hr   →  ○Hr            ○Hr

·AVERAGE BATTERY
 TEMPERATURE          ○°C   →  ○°C            ○Hr

·BATTERY
 REFRESH           NO REFRESHING → REFRESHING  ○Hr
```

FIG.9

```
       BATTERY DEGRADATION
       DIAGNOSIS DISPLAY
          <FOR DEALER>

┌──────────────┐   ┌──────────────┐
    │ TIME DISPLAY │   │  DISTANCE    │
    │              │   │  DISPLAY     │
    └──────────────┘   └──────────────┘
```

FIG.10

|  | ACTUAL USE | LIFE EXPECTANCY |
|---|---|---|
| CURRENT STATUS | ○○○○Hr | ○○○Hr |
| AFTER IMPROVEMENT | ○○○○Hr | ○○○Hr |

40B

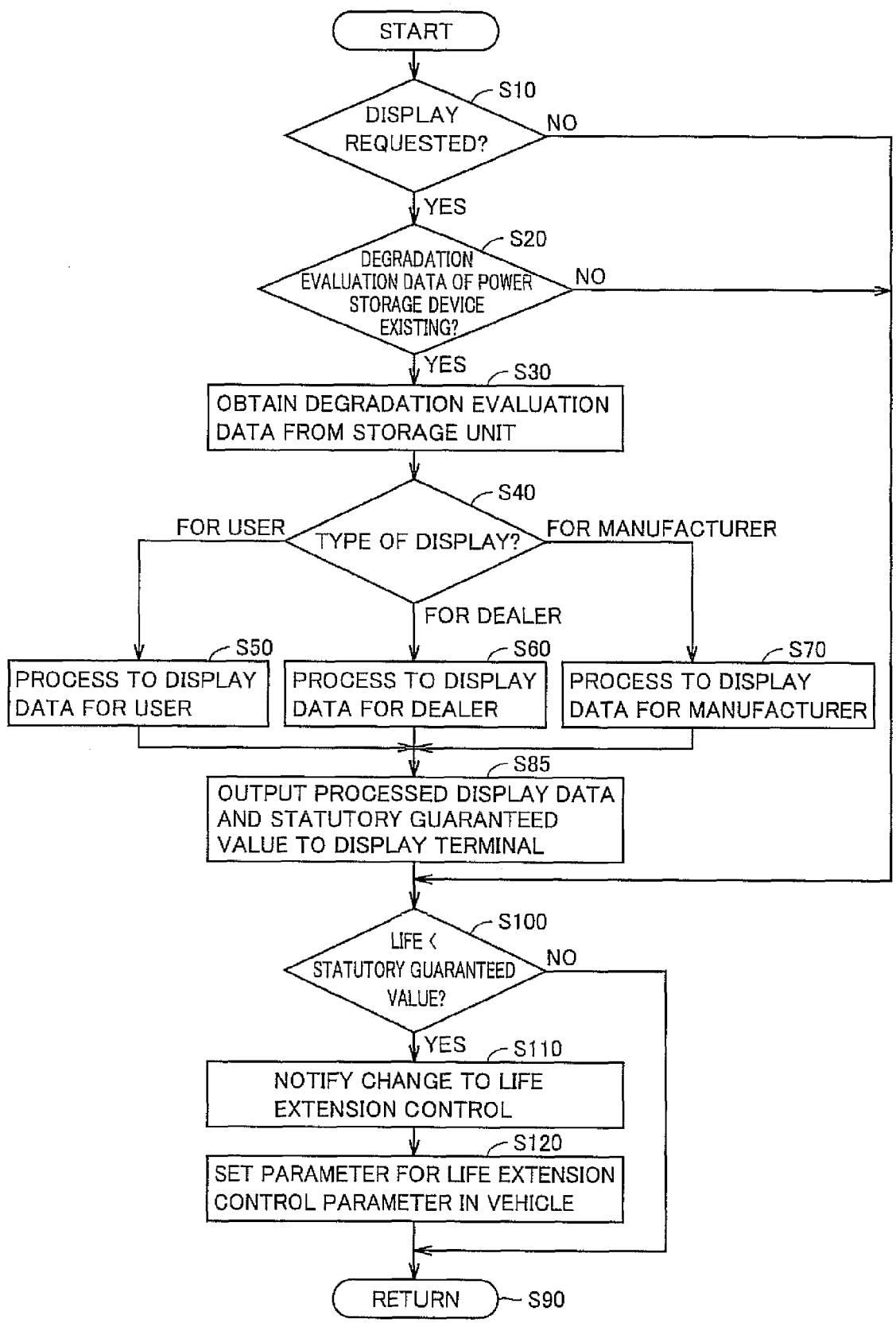

SYSTEM AND METHOD FOR DISPLAYING DEGRADATION OF POWER STORAGE DEVICE

This nonprovisional application is based on Japanese Patent Application No. 2008-181524 filed with the Japan Patent Office on Jul. 11, 2008, the entire contents of which are hereby incorporated by reference.

BACKGROUND OF THE INVENTION

1. Field of the Invention

The present invention relates to system and method for displaying degradation of a power storage device and, more specifically, to degradation displaying system and method for displaying information related to evaluated state of degradation of a power storage device for running mounted on a vehicle.

2. Description of the Background Art

Japanese Patent Laying-Open No. 5-227669 discloses a battery charger for an electric vehicle. The battery charger is provided with a battery management system in which a database of information related to a battery mounted on an electric vehicle is formed and all pieces of information are recorded and diagnosed on the charger side to enable appropriate charging and the like in accordance with the state of use of the battery.

Specifically, a battery, an IC card reader/writer, a vehicle sensor for detecting driving information related to the vehicle, a battery sensor for detecting information of the battery at the time of use and the like are mounted on the vehicle. Signals from the vehicle sensor and the battery sensor are input to the IC card reader/writer, and recorded on an IC card. The information recorded on the IC card is read as needed by the IC card reader/writer and displayed on a display unit on the vehicle. Thus, it is possible for a driver to know battery charge amount, life and so on.

At a charge service station, a charging facility, a charger control unit, an IC card reader/writer and the like are provided. The IC card reader/writer includes analyzing means for reading battery-related information recorded on an IC card and for obtaining resulting diagnosis related to charging, and the resulting diagnosis is applied to the charger control unit. The charger control unit controls start and end of charging by the charger, charging voltage and current and so on, in accordance with the diagnosis applied from the IC card reader/writer.

The battery charger enables efficient charging in accordance with the types of batteries based on the battery diagnosis and prevents loss of electric energy.

The battery charger described above displays state of degradation such as battery life to a user (driver) of the vehicle, while there is a need among dealers in charge of vehicle maintenance and vehicle manufacturers to know the state of degradation of power storage devices for running (batteries and capacitors). Knowing the state of degradation of the power storage device, it becomes possible for the dealers to do appropriate maintenance, and it becomes possible for the manufacturers to examine the state of degradation of the power storage device with the result of examination fed-back for future improvement.

Users, dealers and manufacturers, however, want different pieces of information, and it is necessary to display state of degradation appropriate for intended use of each of the users, dealers and manufacturers. The battery charger disclosed in the laid-open application described above does not include any consideration from such a viewpoint.

SUMMARY OF THE INVENTION

The present invention was made to solve such a problem, and its object is to provide a displaying system that enables display of information related to the state of degradation of a power storage device appropriate for each recipient.

Another object of the present invention is to provide a method that enables display of information related to the state of degradation of a power storage device appropriate for each recipient.

The present invention provides a displaying system for displaying information related to state of degradation evaluated for a power storage device for running mounted on a vehicle, including a data processing unit and a display unit. The data processing unit processes the information related to the state of degradation to a first display item for a user of the vehicle, a second display item for a dealer in charge of maintenance of the vehicle, and a third display item for a manufacturer of the vehicle. The display unit displays the information processed by the data processing unit to the first to third display items, to the user, the dealer and the manufacturer.

Preferably, the first display item includes information related to life of the power storage device.

More preferably, the information related to life of the power storage device includes information related to lifetime guarantee designated by law in a region where the vehicle is used, and information related to life evaluated based on actual use of the power storage device.

Preferably, the second display item includes information related to state of malfunction occurrence of the power storage device.

Preferably, the third display item includes information indicating expected degradation of the power storage device analyzed in advance, and information indicating actual degradation evaluated based on actual use of the power storage device.

Preferably, the displaying system further includes a display control unit. The display control unit switches the information to be displayed on the display unit to any of the first to third display items in accordance with a request from a user of the display unit.

Further, the present invention provides a method for displaying information related to state of degradation evaluated for a power storage device for running mounted on a vehicle, including the steps of: processing the information related to the state of degradation to a first display item for a user of the vehicle, a second display item for a dealer in charge of maintenance of the vehicle, and a third display item for a manufacturer of the vehicle; and displaying the information processed to the first to third display items, to the user, the dealer and the manufacturer.

Preferably, the first display item includes information related to life of the power storage device.

More preferably, the information related to life of the power storage device includes information related to lifetime guarantee designated by law in a region where the vehicle is used, and information related to life evaluated based on actual use of the power storage device.

Preferably, the second display item includes information related to state of malfunction occurrence of the power storage device.

Preferably, the third display item includes information indicating expected degradation of the power storage device analyzed in advance, and information indicating actual degradation evaluated based on actual use of the power storage device.

Preferably, the method further includes the step of switching, in accordance with a request from a user who use the information related to state of degradation, the information to be displayed to the user to any of the first to third display items.

According to the present invention, information related to the state of degradation evaluated on the power storage device for running is displayed after it is processed for users of the vehicle, for dealers doing maintenance of the vehicle, and manufactures of the vehicle.

Therefore, by the present invention, it is possible to appropriately display the information related to the state of degradation of the power storage device for each recipient (user, dealer, or manufacturer).

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a third illustration showing a display of battery degradation diagnosis "FOR USER."

FIG. 9 is a first illustration showing a display of battery degradation diagnosis "FOR DEALER."

FIG. 10 is a second illustration showing a display of battery degradation diagnosis "FOR DEALER."

FIG. 25 is a flowchart representing a process related to the display of power storage device degradation, by the charging/discharging device in accordance with Embodiment 2.

DESCRIPTION OF THE PREFERRED EMBODIMENTS

Figure 1:
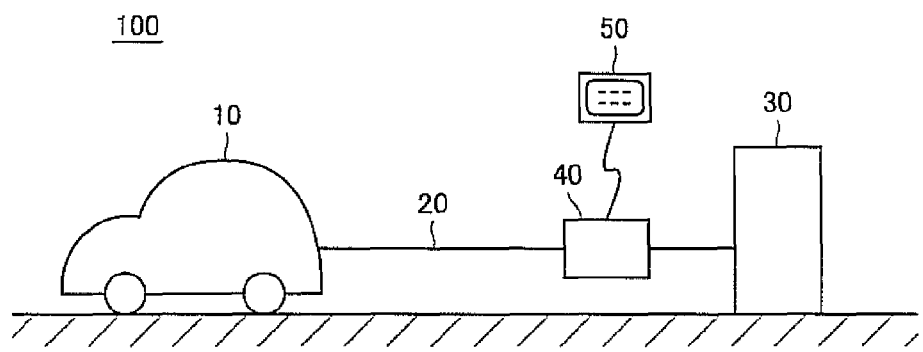
FIG. 1 is an illustration of the overall system for displaying degradation of power storage device in accordance with Embodiment 1 of the present invention.

In the following, embodiments of the present invention will be described in detail with reference to the figures. In the figures, the same or corresponding portions are denoted by the same reference characters and description thereof will not be repeated.

Embodiment 1

FIG. 1 is an illustration of the overall system for displaying degradation of power storage device in accordance with Embodiment 1 of the present invention. Referring to FIG. 1, the system 100 for displaying degradation of power storage device includes a vehicle 10, a power cable 20, a power station 30, a charging/discharging device 40, and a display terminal 50.

Vehicle 10 is an electric-powered vehicle mounting a power storage device and a motor as driving power sources, implemented, for example, by an electric vehicle, a hybrid vehicle or a fuel cell vehicle. Vehicle 10 is connectable to power station 30 by power cable 20 and, by charging/discharging device 40 provided on power cable 20, it is possible to charge the power storage device from power station 30 and to supply power from the power storage device to power station 30.

Power cable 20 is a power line for electrically connecting power station 30 to vehicle 10. Further, power cable 20 is also used as a data communication medium between vehicle 10 and charging/discharging device 40. Power station 30 is capable of supplying charging power to vehicle 10 through power cable 20 and capable of receiving power from vehicle 10 and supplying the power to mains power supply or to various loads.

When the power storage device of vehicle 10 is charged from power station 30, charging/discharging device 40 controls power supply from power station 30 to vehicle 10. Further, when power is supplied from vehicle 10 to power station 30, charging/discharging device 40 controls power supply from vehicle 10 to power station 30.

Further, charging/discharging device 40 collects data of power storage device mounted on vehicle 10 through power cable 20, and evaluates state of degradation of power storage device. Charging/discharging device 40 processes the data related to evaluated state of degradation to a first display item for the user of vehicle 10, a second display item for the dealer in charge of maintenance of vehicle 10, and a third display item for the manufacturer of vehicle 10, and outputs these to display terminal 50.

Display terminal 50 is connected to charging/discharging device 40 and capable of switching and displaying the display data processed to the first display item for the user, the second display item for the dealer, and the third display item for the manufacturer, as requested by the user of the terminal.

Figure 2:
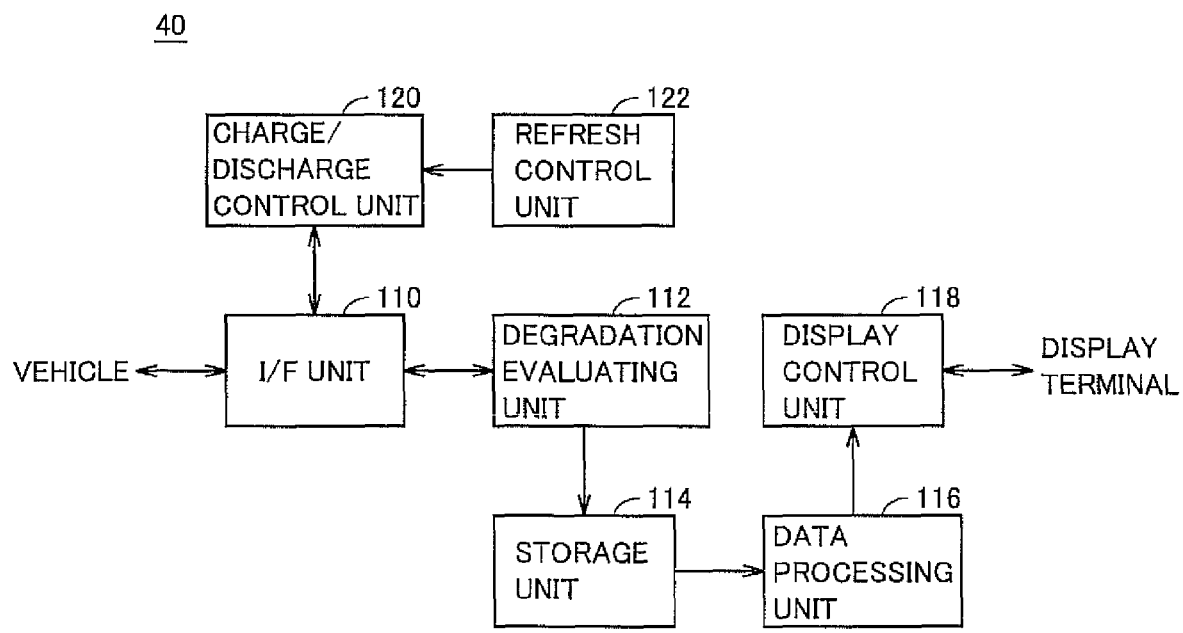
FIG. 2 is a functional block diagram of the charging/discharging device shown in FIG. 1.

FIG. 2 is a functional block diagram of charging/discharging device 40 shown in FIG. 1. Referring to FIG. 2, charging/discharging device 40 includes an interface (I/F) unit 110, a degradation evaluating unit 112, a storage unit 114, a data processing unit 116, a display control unit 118, a charge/discharge control unit 120, and a refresh control unit 122.

I/F unit 110 communicates with vehicle 10 through power cable 20. I/F unit 110 controls communication between charge/discharge control unit 120 and vehicle 10, when the power storage device of vehicle 10 is charged from power station 30 or when power is supplied from vehicle 10 to power station 30. Further, I/F unit 110 receives data for evaluating state of degradation of power storage device of vehicle 10 from vehicle 10 through power cable 20, and outputs the received data to degradation evaluating unit 112. I/F unit 110 is implemented, for example, by a communication device such as a modem.

Degradation evaluating unit 112 collects data related to the power storage device from vehicle 10, and based on the collected data, evaluates the state of degradation of power storage device. By way of example, degradation evaluating unit 112 evaluates state of degradation such as life of power storage device and cell-by-cell state of malfunction, using data of voltage, current, temperature and the like of power storage device under conditions of more stable environment than during running of the vehicle, for example, at the time of charging the power storage device of vehicle 10 from power station 30 or at the time of power supply from vehicle 10 to power station 30. Then, degradation evaluating unit 112 outputs the data related to evaluated state of degradation to storage unit 114. Storage unit 114 stores data related to the state of degradation of power storage device evaluated by degradation evaluating unit 112.

Data processing unit 116 reads the data related to the state of degradation of power storage device evaluated by degradation evaluating unit 112 from storage unit 114, and processes the read data related to the state of degradation to the first display item for the user, the second display item for the dealer, and the third display item for the manufacturer. Specifically, in order to allow the user to easily grasp the life of power storage device, data processing unit 116 processes the data to data related to the life of power storage device as the first display item for the user. Further, in order to allow the dealer to grasp the state of power storage device and to provide appropriate description for the user, data processing unit 116 processes the data to data related to the state of malfunction of power storage device as the second display item for the dealer. Further, in order to verify the state of degradation of power storage device and to enable feedback for future improvement, data processing unit 116 processes the data to data comparing expected degradation of power storage device analyzed in advance with the actual degradation evaluated based on the actual use of power storage device, as the third display item for the manufacturer.

Display control unit 118 controls display of display terminal 50 connected to charging/discharging device 40. Specifically, receiving a request from display terminal 50 for the display for the user of vehicle 10, display control unit 118 instructs data processing unit 116 to process the data related to the state of degradation evaluated by degradation evaluating unit 112 to the first display item for the user, and outputs the data processed by data processing unit 116 to display terminal 50. Further, receiving a request from display terminal 50 for the display for the dealer, display control unit 118 instructs data processing unit 116 to process the data related to the state of degradation evaluated by degradation evaluating unit 112 to the second display item for the dealer, and outputs the data processed by data processing unit 116 to display terminal 50. Further, receiving a request from display terminal 50 for the display for the manufacturer, display control unit 118 instructs data processing unit 116 to process the data related to the state of degradation evaluated by degradation evaluating unit 112 to the third display item for the manufacturer, and outputs the data processed by data processing unit 116 to display terminal 50.

When the power storage device of vehicle 10 is to be charged from power station 30, charge/discharge control unit 120 outputs a charge execution instruction for executing charging of the power storage device to vehicle 10 through I/F unit 110. Further, when power is to be supplied from vehicle 10 to power station 30, charge/discharge control unit 120 outputs a power supply execution instruction for executing power supply from vehicle 10 to power station 30 to vehicle 10 through I/F unit 110.

Refresh control unit 122 controls refreshing of power storage device, by attaining substantially fully charged or fully discharged state of power storage device, in order to recover the device from degradation caused by sulfation or decrease of charging/discharging capacity resulting from so-called memory effect. Receiving a refresh request of power storage device, refresh control unit 122 outputs a charge/discharge instruction to charge/discharge control unit 120, to bring the power storage device close to the fully charged or fully discharged state.

Figure 3:
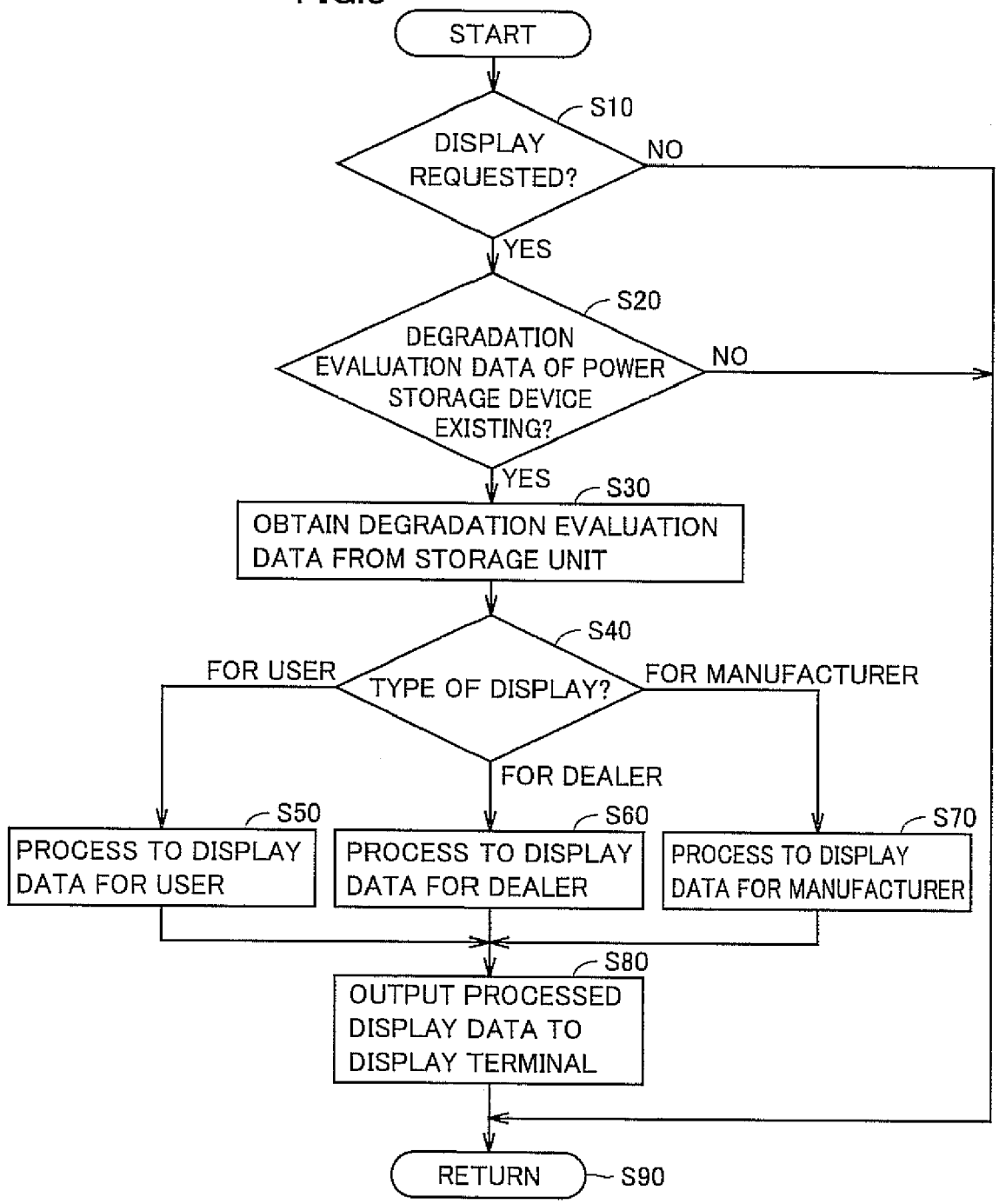
FIG. 3 is a flowchart representing a process related to the display of power storage device degradation, by the charging/discharging device shown in FIG. 1.

FIG. 3 is a flowchart representing the process related to degradation display of power storage device by the charging/discharging device 40 shown in FIG. 1. The process of the flowchart is called from a main routine and executed at every prescribed time interval or every time prescribed conditions are satisfied.

Referring to FIG. 3, display control unit 118 of charging/discharging device 40 determines whether or not a display request has been received from display terminal 50 (step S10). If there is no display request received from display terminal 50 (NO at step S10), following operations are not executed and the process proceeds to step S90.

If it is determined at step S10 that there has been a display request from display terminal 50 (YES at step S10), a notice to that effect is transmitted from display control unit 118 to data processing unit 116. Then, data processing unit 116 determines whether or not data related to the state of degradation of power storage device (degradation evaluation data) is stored in storage unit 114 (step S20). If the data is not stored in storage unit 114 (NO at step S20), following operations are not executed and the process proceeds to step S90.

If it is determined at step S20 that the data exists in storage unit 114 (YES at step S20), data processing unit 116 obtains the degradation evaluation data from storage unit 114 (step S30). If the type of display requested by display terminal 50 is for the user ("FOR USER" at step S40), data processing unit 116 processes the data obtained from storage unit 114 to the first display item for the user (step S50). If the type of display requested by display terminal 50 is for the dealer ("FOR DEALER" at step S40), data processing unit 116 processes the data obtained from storage unit 114 to the second display item for the dealer (step S60). If the type of display requested by display terminal 50 is for the manufacturer ("FOR MANUFACTURER" at step S40), data processing unit 116 processes the data obtained from storage unit 114 to the third display item for the manufacturer (step S70).

Then, data processing unit 116 outputs the display data processed in accordance with the type of display to display control unit 118, and display control unit 118 outputs the display data received from data processing unit 116 to display terminal 50 (step S80).

Figure 4:
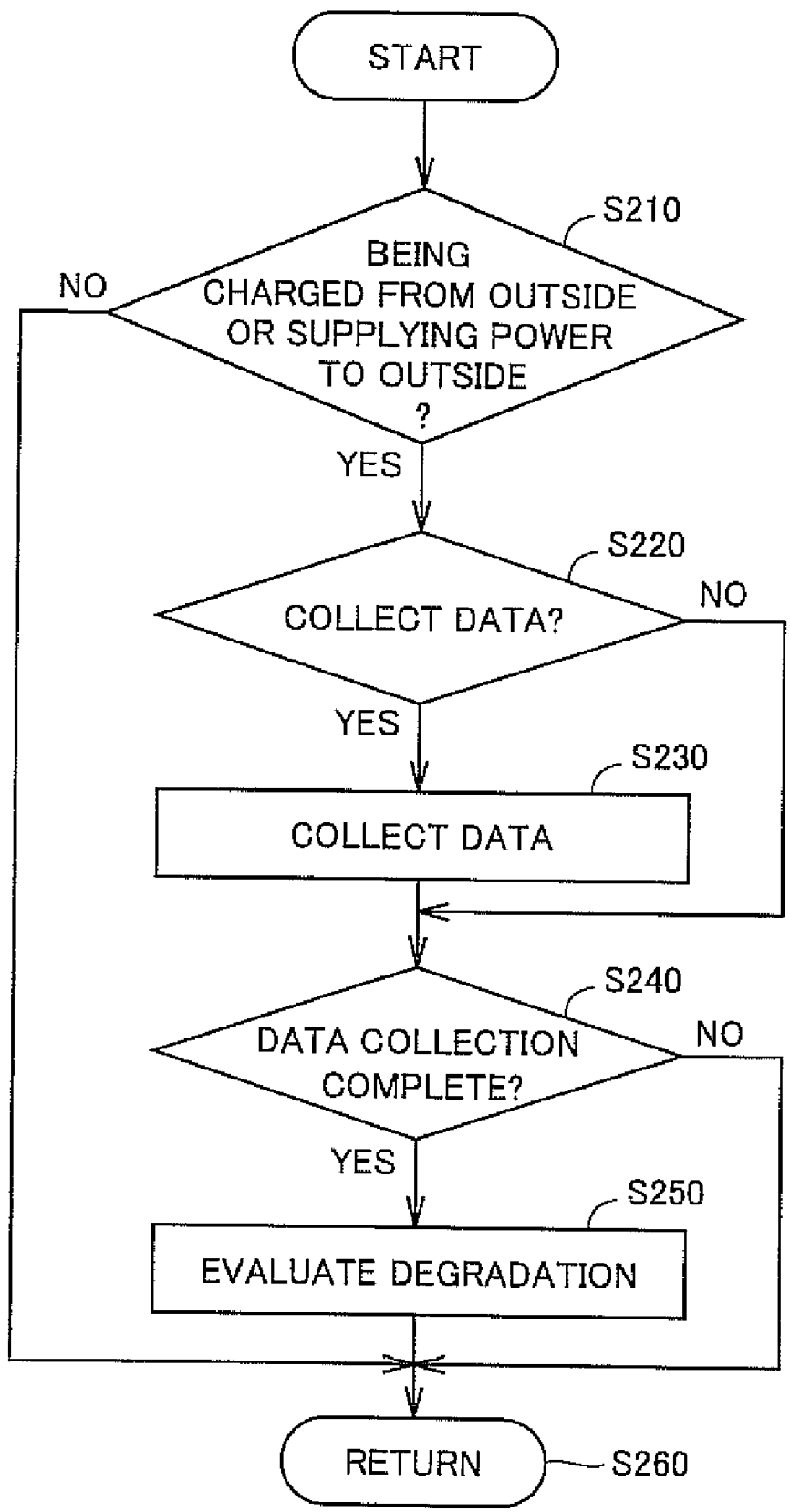
FIG. 4 is a flowchart representing a process related to the evaluation of power storage device degradation, by the charging/discharging device shown in FIG. 1.

FIG. 4 is a flowchart representing a process related to the evaluation of power storage device degradation performed by charging/discharging device 40 shown in FIG. 1. The process of the flowchart is called from a main routine and executed at every prescribed time interval or every time prescribed conditions are satisfied.

Referring to FIG. 4, when the power storage device of vehicle 10 is being charged from power station 30 or when power is being supplied from vehicle 10 to power station 30 (YES at step S210), degradation evaluating unit 112 determines whether or not data is to be collected for evaluating the state of degradation of power storage device (step S220).

If it is determined that data collection should be performed (YES at S220), degradation evaluating unit 112 issues a notice to that effect to vehicle 10 through I/F unit 110, and collects detected data of voltage, current and temperature of the power storage device as well as data of current and voltage exchanged through power cable 20, from vehicle 10 (step S230). If it is determined at step S220 that data collection is not to be performed (NO at step S220), the process proceeds to step S240.

Next, degradation evaluating unit 112 determines whether or not data collection has been completed (step S240). If degradation evaluating unit 112 determines that data collection is not yet completed (NO at step S240), the process proceeds to step S260.

If it is determined at step S240 that data collection is completed (YES at step S240), degradation evaluating unit 112 evaluates the state of degradation of power storage device of vehicle 10, using the data collected at step S230 (step S250). By way of example, degradation evaluating unit 112 calculates charging efficiency of the power storage device based on the collected data, and based on the calculated charging efficiency, evaluates the life of power storage device. The life evaluation utilizes the phenomenon that charging efficiency of the power storage device decreases as the power storage device degrades.

Figure 5:
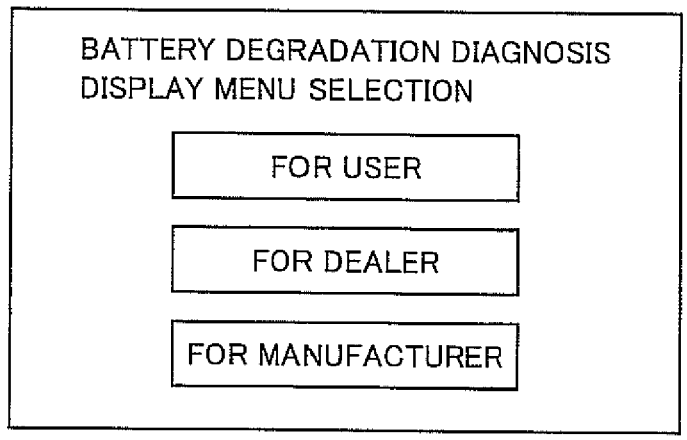
FIG. 5 shows an image for display menu selection.

FIGS. 5 to 17 show exemplary images displayed on display terminal 50. FIG. 5 shows a display menu selection image as a top image of the degradation diagnosis display of the power storage device. It is possible from the display menu selection image to select display "FOR USER", "FOR DEALER" and "FOR MANUFACTURER." Though not specifically shown, entry of a personal identification number of the terminal user may be requested, so as to prevent selection of display "FOR DEALER" or "FOR MANUFACTURER" by the user of the vehicle.

Figure 6:
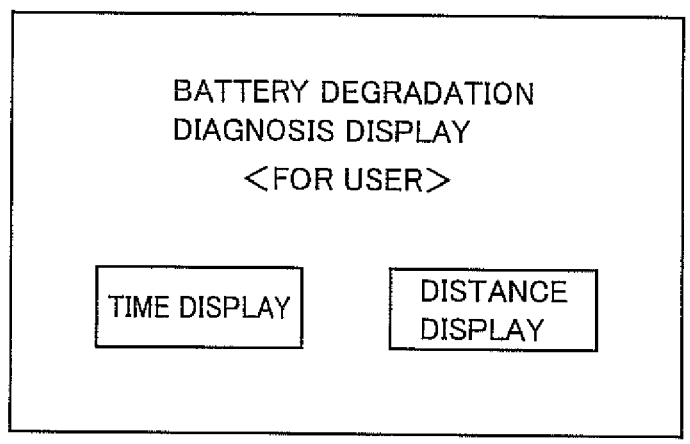
FIG. 6 is a first illustration showing a display of battery degradation diagnosis "FOR USER."
Figure 7:
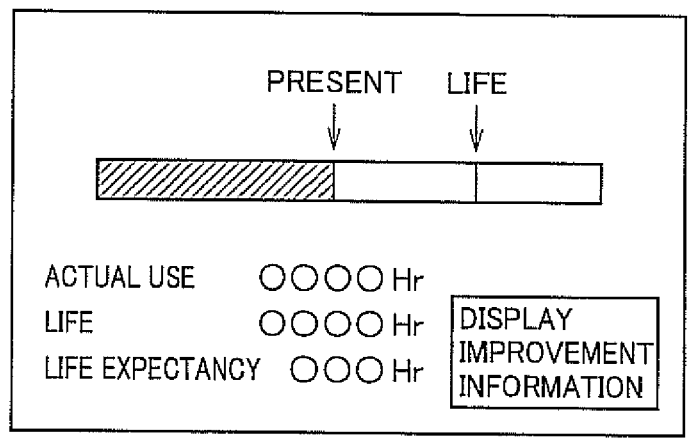
FIG. 7 is a second illustration showing a display of battery degradation diagnosis "FOR USER."

FIGS. 6 to 8 show exemplary displays when "FOR USER" is selected on the display menu selection image shown in FIG. 5. When "FOR USER" is selected on the display menu selection image, a top image of the degradation diagnosis display "FOR USER" appears (FIG. 6). When "TIME DISPLAY" is selected on this image, the state of degradation of power storage device is displayed in terms of time of use, and when "DISTANCE DISPLAY" is selected, the state of degradation of power storage device is displayed in terms of running distance. FIG. 7 shows an exemplary display when "TIME DISPLAY" is selected from the image shown in FIG. 6. Here, the data as the first display item processed by data processing unit 116 (FIG. 2) of charging/discharging device 40, that is, actual use, life and expected life of the power storage device are displayed in the form of a graph, by the unit of time. Thus, it is possible for the user to easily grasp the life of power storage device.

Further, when "DISPLAY IMPROVEMENT INFORMATION" is selected on the image shown in FIG. 7, improvement information urging the user to change the manner of use of vehicle 10 appears, for improving the life of power storage device (FIG. 8). By way of example, reducing the speed of braking operation prevents abrupt introduction of regenerative power resulting from regenerative braking to the power storage device and, as a result, contributes to improved life of the power storage device. Further, limitation of charging time from power station 30 to the power storage device of vehicle 10 also contributes to improved life of power storage device, as the load on power storage device reduces. Further, use of the power storage device at a very low temperature or high temperature imposes significant load on the power storage device and, therefore, limiting the temperature of use of power storage device also contributes to improved life of the power storage device. Further, refresh control of power storage device recovers the device from degradation caused by the memory effect or sulfation and, therefore, it contributes to improved life of the power storage device. On these items, current values, improved value (target value), and estimated life expectancy after improvement are displayed.

FIGS. 9 to 14 show exemplary displays when "FOR DEALER" is selected from the display menu selection image shown in FIG. 5. When "FOR DEALER" is selected on the display menu selection image, a top image of the degradation diagnosis display "FOR DEALER" appears (FIG. 9). As in the case of "FOR USER", when "TIME DISPLAY" is selected on this image, the state of degradation of power storage device is displayed in terms of time of use, and when "DISTANCE DISPLAY" is selected, the state of degradation of power storage device is displayed in terms of running distance. FIG. 10 shows an exemplary display when "TIME DISPLAY" is selected from the image shown in FIG. 9. In the displayed image, "CURRENT STATUS" represents the current state of degradation of power storage device, and "IMPROVEMENT" shows expected state of degradation when "IMPROVEMENT" shown in FIG. 8 is executed.

Figure 11:
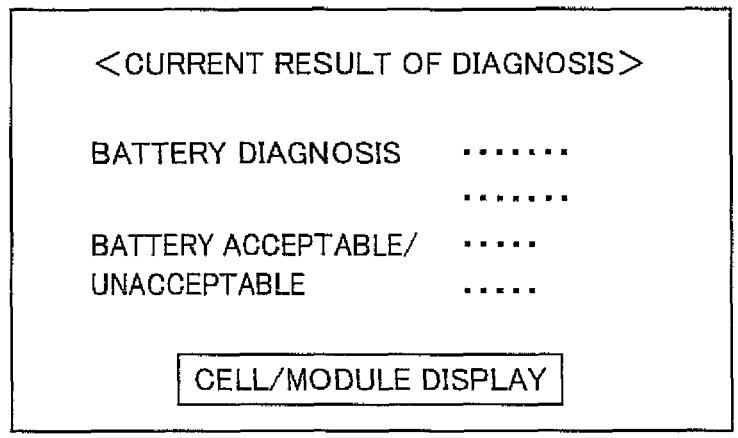
FIG. 11 is a third illustration showing a display of battery degradation diagnosis "FOR DEALER."
Figure 12:
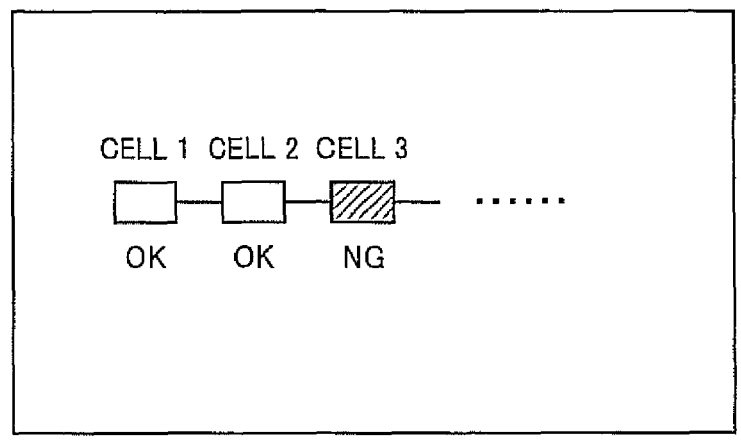
FIG. 12 is a fourth illustration showing a display of battery degradation diagnosis "FOR DEALER."

When "CURRENT STATUS" is selected on the image shown in FIG. 10, details of the current state of degradation are displayed (FIG. 11). Further, when "CELL/MODULE DISPLAY" is selected on the image shown in FIG. 11, result of normal/abnormal diagnosis for each cell of the power storage device is displayed (FIG. 12). Based on these displays, it becomes possible for the dealer to perform appropriate maintenance of the power storage device mounted on vehicle 10.

Figure 13:
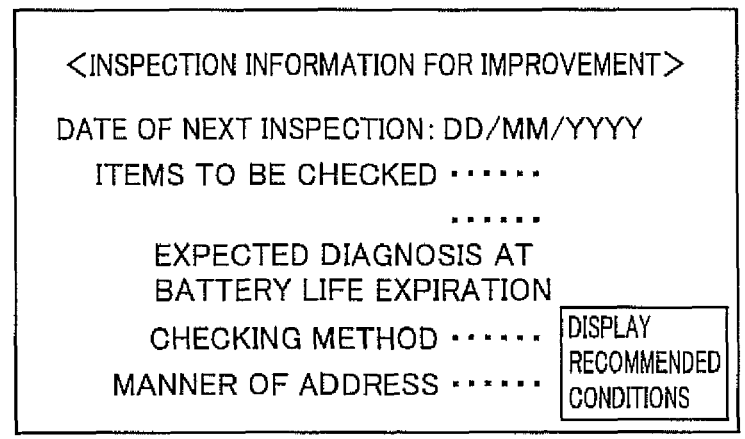
FIG. 13 is a fifth illustration showing a display of battery degradation diagnosis "FOR DEALER."

When "IMPROVEMENT" is selected on the image shown in FIG. 10, information related to future inspection when "IMPROVEMENT" shown in FIG. 8 is selected is displayed (FIG. 13). By way of example, expected date of next inspection and items to be checked at that time, and expected diagnosis (malfunction display) that will be displayed when the life of power storage device expires are displayed.

Figure 14:
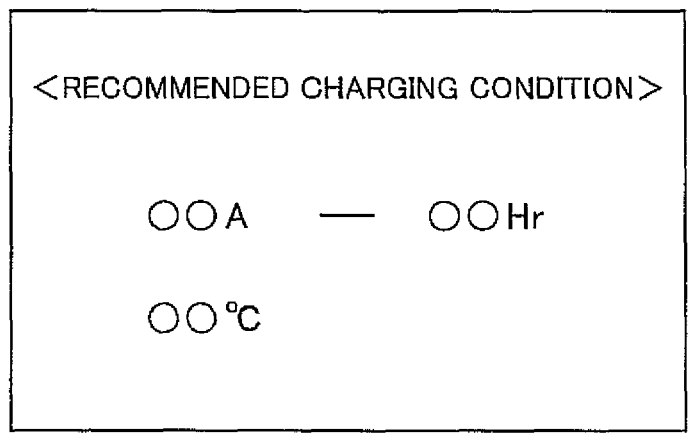
FIG. 14 is a sixth illustration showing a display of battery degradation diagnosis "FOR DEALER."

Further, when "DISPLAY RECOMMENDED CONDITIONS" is selected on the image shown in FIG. 13, recommended conditions for charging when the power storage device 10 is charged from power station 30 are displayed (FIG. 14). It is possible for the dealer to quantitatively grasp the state of degradation of the power storage device based on such displays, and to appropriately describe to the user of vehicle 10.

Figure 15:
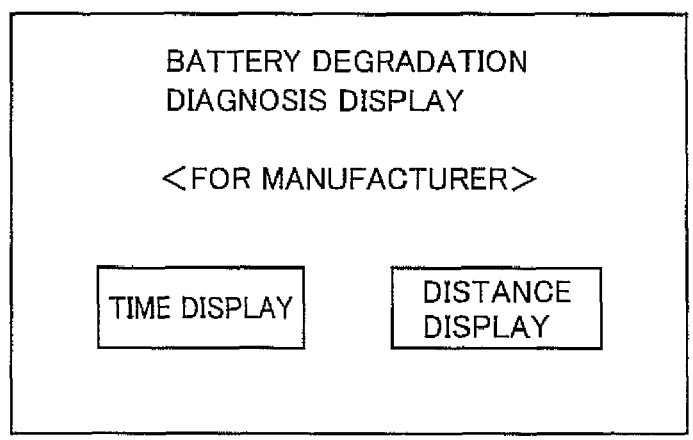
FIG. 15 is a first illustration showing a display of battery degradation diagnosis "FOR MANUFACTURER."
Figure 16:
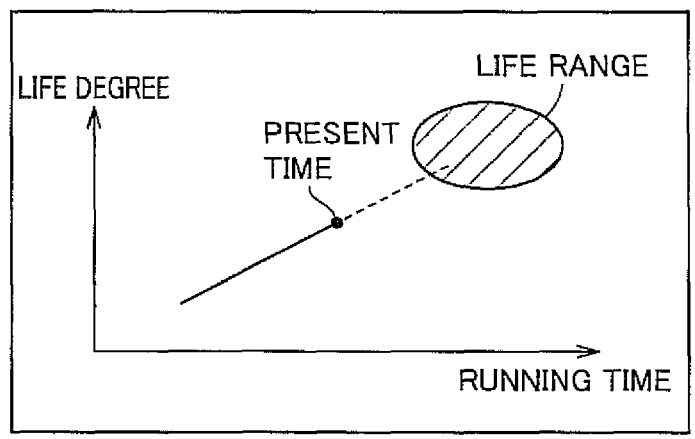
FIG. 16 is a second illustration showing a display of battery degradation diagnosis "FOR MANUFACTURER."
Figure 17:
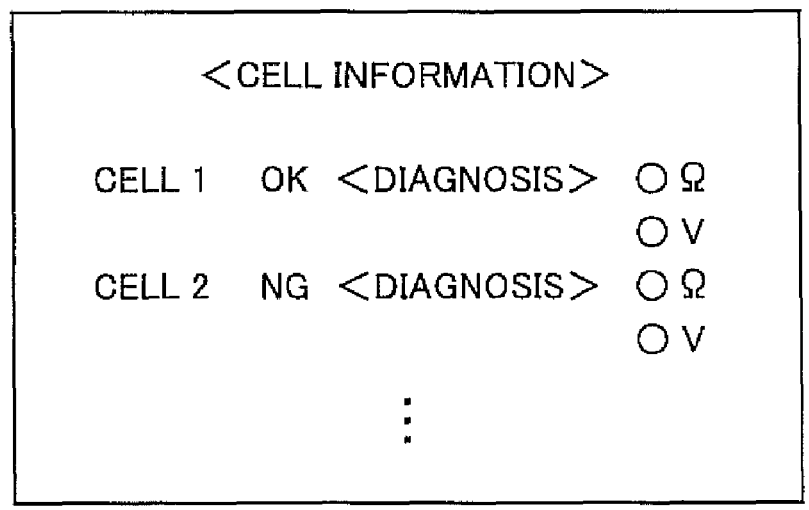
FIG. 17 is a third illustration showing a display of battery degradation diagnosis "FOR MANUFACTURER."

FIGS. 15 to 17 show exemplary displays when "FOR MANUFACTURER" is selected from the display menu selection image shown in FIG. 5. When "FOR MANUFACTURER" is selected on the display menu selection image, a top image of the degradation diagnosis display "FOR MANUFACTURER" appears (FIG. 15). As in the case of "FOR USER", when "TIME DISPLAY" is selected on this image, the state of degradation of power storage device is displayed in terms of time of use, and when "DISTANCE DISPLAY" is selected, the state of degradation of power storage device is displayed in terms of running distance.

FIG. 16 shows an exemplary display when "TIME DISPLAY" is selected from the image shown in FIG. 15. In the displayed image, the progress of degradation of the power storage device mounted on vehicle 10 is displayed in such a form that allows comparison with a life expectancy map (life range) analyzed based on data of a large number of power storage devices collected by the manufacturer. The life expectancy map (life range) is prepared beforehand by the manufacturer and installed in charging/discharging device 40 or display terminal 50 using a transmission medium such as the Internet or a recording medium. Further, as the data allowing more detailed analysis of the state of degradation, detailed diagnosis (malfunction information) of each cell of the storage device is also displayed (FIG. 17). It is possible for personnel at the manufacturer to verify whether the life of power storage device corresponds to the expected life as originally designed based on these displays and to feedback the result for future improvement.

Figure 18:
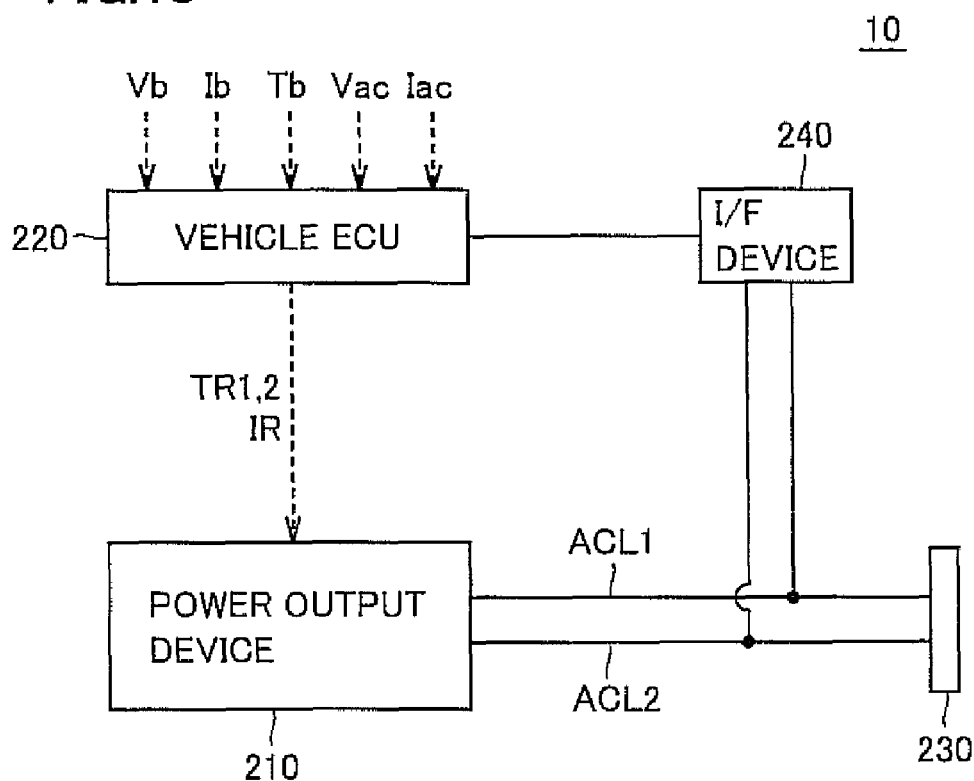
FIG. 18 shows a schematic configuration of the vehicle shown in FIG. 1.

Next, the structure of vehicle 10 shown in FIG. 1 will be described. FIG. 18 is a schematic diagram showing the structure of vehicle 10 shown in FIG. 1. Referring to FIG. 18, vehicle 10 includes a power output device 210, a vehicle ECU (Electric Control Unit) 220, power lines ACL1 and ACL2, a connector 230, and an I/F device 240.

Power output device 210 outputs driving force for the vehicle 10. Power output device 210 is capable of giving and receiving electric power to/from power station 30 (FIG. 1) through power cable 20 (FIG. 1) connected to connector 230. The structure of power output device 210 will be described later. Connector 230 is a power interface for electrically connecting power cable 20 to vehicle 10. I/F device 240 is connected to power lines ACL1 and ACL2, and communicates with charging/discharging device 40 (FIG. 1) provided on power cable 20 through power lines ALC1 and ACL 2 as well as power cable 20. I/F device 240 is implemented, for example, by a communication device such as a modem.

When the vehicle operation mode is running mode, vehicle ECU 220 generates torque command values TR1 and TR2 of motor generators included in power output device 210, and outputs the generated torque command values TR1 and TR2 to power output device 210.

Further, when the operation mode is charging mode, vehicle ECU 220 generates a current command IR as a target value of charging current from power station 30, and outputs it to power output device 210. Further, if the operation mode is power supply mode, vehicle ECU 220 generates a current command IR as a target value of power supply current to power station 30, and outputs it to power output device 210.

Further, when the operation mode is the charging mode or power supply mode and power is being exchanged to/from power station 30, vehicle ECU 220 outputs detected values of voltage Vb, current Ib and temperature Tb of the power storage device in vehicle 10 and current Iac and voltage Vac of power lines ACL1 and ACL2 to charging/discharging device 40 through I/F device 240. The data of these detected values are used for evaluating the state of degradation of power storage device by charging/discharging device 40.

Figure 19:
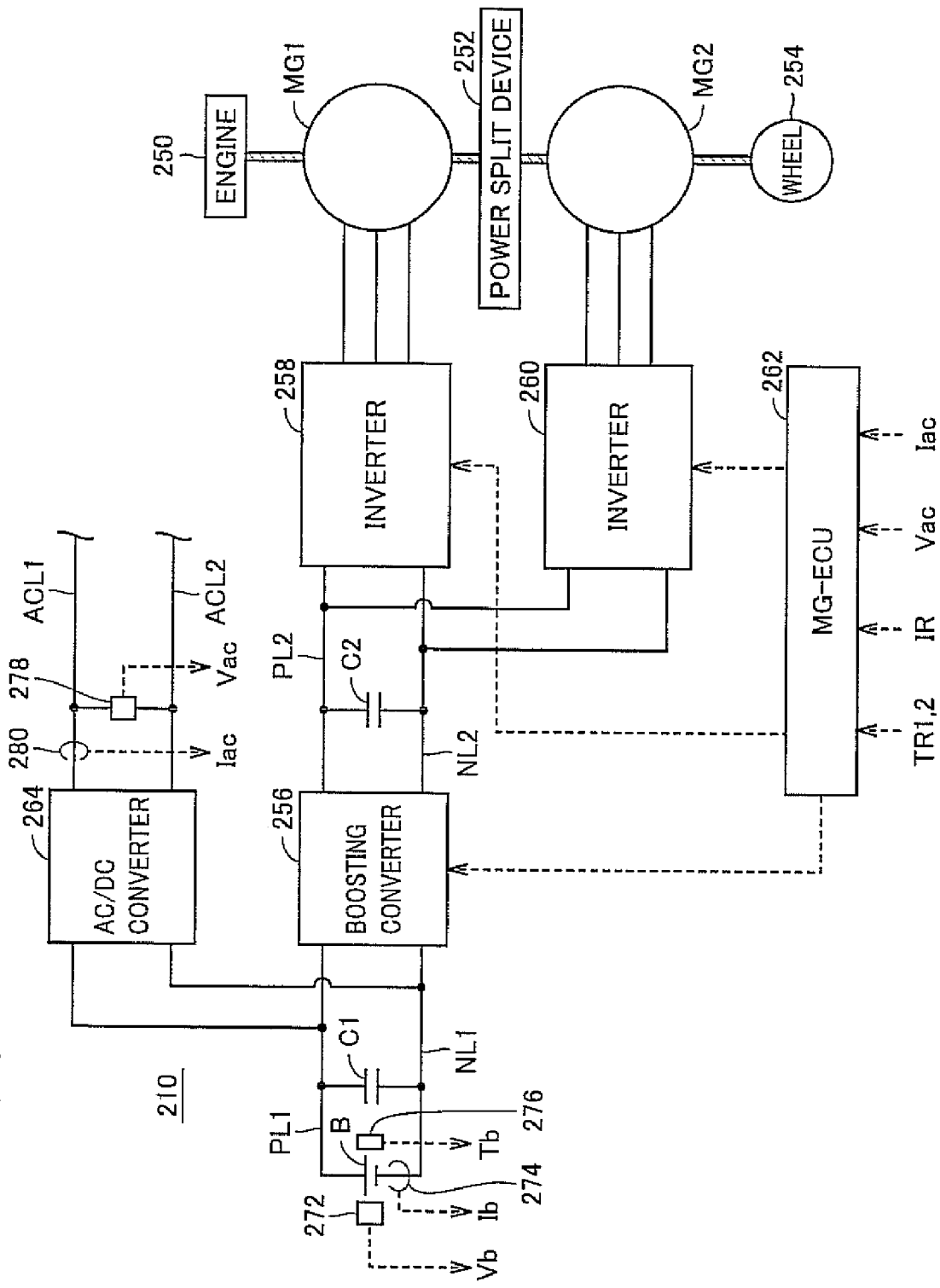
FIG. 19 is a functional block diagram of the power output device shown in FIG. 18.

FIG. 19 is a functional block diagram of power output device 210 shown in FIG. 18. Referring to FIG. 19, power output device 210 includes an engine 250, motor generators MG1 and MG2, a power split device 252 and wheels 254. Further, power output device 210 additionally includes power storage device B, a boosting converter 256, inverters 258 and 260, an MG-ECU 262, positive power lines PL1 and PL2, negative power lines NL1 and NL2, capacitors C1 and C2, and an AC/DC converter 264. Power output device 210 further includes voltage sensors 272 and 278, current sensors 274 and 280, and a temperature sensor 276.

Power split device 252 is coupled to an engine 250 and motor generators MG1 and MG2 and distributes power among these. By way of example, a planetary gear having three rotation shafts of sun gear, planetary carrier and ring gear may be used as power split device 252. Motor generator MG1 is incorporated in power output device 210 as a generator driven by engine 250 and also as a motor that can start the operation of engine 250. Motor generator MG2 is incorporated in power output device 210 as a motor that drives wheel 254 as a driving wheel.

Power storage device B is a rechargeable DC power source and, by way of example, it is implemented by a secondary battery such as a nickel hydride or lithium ion secondary battery. In the running mode, power storage device B supplies electric power to boosting converter 256, and charged by the power output from boosting converter 256. In the charging mode, power storage device B is charged, receiving charging power from power station 30 through AC/DC converter 264. In the power supply mode, power storage device B outputs electric power to be supplied to power station 30 to AC/DC converter 264.

Capacitor C1 smoothes voltage fluctuation between positive power line PL1 and negative power line NL1. Boosting converter 256 boosts DC voltage received from power storage device B and outputs the boosted voltage to positive power line PL2. Further, boosting converter 256 lowers the DC voltage received from inverters 258 and 260 through positive power line PL2 to a voltage level of power storage device B and charges power storage device B. Boosting converter 256 is formed, for example, by a step-up/step-down type chopper circuit.

Capacitor C2 smoothes voltage fluctuation between positive power line PL2 and negative power line NL2. Inverter 258 converts DC voltage received from positive power line PL2 to three-phase AC voltage, and outputs the converted three-phase AC voltage to motor generator MG1. Further, inverter 258 receives an output of engine 250, and converts the three-phase AC voltage generated by motor generator MG1 to a DC voltage, and outputs the converted DC voltage to positive power line PL2.

Inverter 260 converts the DC voltage received from positive power line PL2 to three-phase AC voltage, and outputs the converted AC voltage to motor generator MG2. Thus, motor generator MG2 is driven to generate the designated torque. Further, at the time of regenerative braking of the vehicle, inverter 260 converts the three-phase AC voltage generated by motor generator MG2 receiving rotational force from wheel 254 to a DC voltage, and outputs the converted DC voltage to positive power line PL2.

Motor generators MG1 and MG2 are three-phase AC generators formed, for example, of three-phase AC synchronous motors. Motor generator MG1 generates a three-phase AC voltage using an output of engine 250, and outputs the generated three-phase AC voltage to inverter 258. Further, motor generator MG1 generates driving force by the three-phase AC voltage received from inverter 258, and starts operation of engine 250. Motor generator MG2 generates driving torque of the vehicle by the three-phase AC voltage received from inverter 260. Further, motor generator MG2 generates a three-phase AC voltage and outputs it to inverter 260 at the time of braking of the vehicle.

In the charging mode, AC/DC converter 264 converts charging power (AC) from power station 30 received through power lines ACL1 and ACL2 to DC power, and outputs the converted DC power to power storage device B. Further, in the power supply mode, AC/DC converter 264 converts DC power output from power storage device B to AC power, and outputs the converted AC power to power lines ACL1 and ACL2 electrically connected to power station 30.

Voltage sensor 272 detects a voltage Vb of power storage device B, and outputs the detected value to vehicle ECU 220 (FIG. 18). Current sensor 274 detects a current Ib input to/output from power storage device B, and outputs the detected value to vehicle ECU 220. Temperature sensor 276 detects temperature Tb of power storage device B, and outputs the detected value to vehicle ECU 220. Voltage sensor 278 detects a voltage Vac between power lines ACL1 and ACL2, and outputs the detected value to MG-ECU 262 and vehicle ECU 220. Current sensor 280 detects a current Iac flowing through power line ACL1, and outputs the detected value to MG-ECU 262 and vehicle ECU 220. Current sensor 280 may detect a current flowing through power line ACL2 and output to MG-ECU 262.

In the running mode, MG-ECU 262 generates control signals for driving boosting converter 256 and inverters 258 and 260 based on the torque command values TR1 and TR2 from vehicle ECU 220, and outputs the generated control signals to boosting converter 256 and inverters 258 and 260.

Further, in the charging mode, MG-ECU 262 generates a control signal for driving AC/DC converter 264 such that it converts the charging power (AC) applied from power station 30 to power lines ACL1 and ACL2 to a DC power to charge power storage device B, based on current command IR from vehicle ECU 220, and outputs the generated control signal to AC/DC converter 264.

Further, in the power supply mode, MG-ECU 262 generates a control signal for driving AC/DC converter 264 such that the DC power output from power storage device B is converted to AC power to be output to power lines ACL1 and ACL2 based on the current command IR from vehicle ECU 220, and outputs the generated control signal to AC/DC converter 264.

As described above, in Embodiment 1, data related to state of degradation evaluated on power storage device B for running mounted on vehicle 10 is processed to the first display item for the user, the second display item for the dealer and the third display item for the manufacturer by data processing unit 116 and switched to be displayed on display terminal 50. Therefore, according to Embodiment 1, it is possible to appropriately display the information related to the state of degradation of power storage device B for the user, dealer and manufacturer of vehicle 10.

[Modification]

In the foregoing description, the display data processed to the first to third display items by data processing unit 116 of charging/discharging device 40 is each displayed on display terminal 50 connected to charging/discharging device 40. The display data processed by data processing unit 116 may be transmitted to each of vehicle 10, the dealer and the manufacturer, to be displayed at each site.

Figure 20:
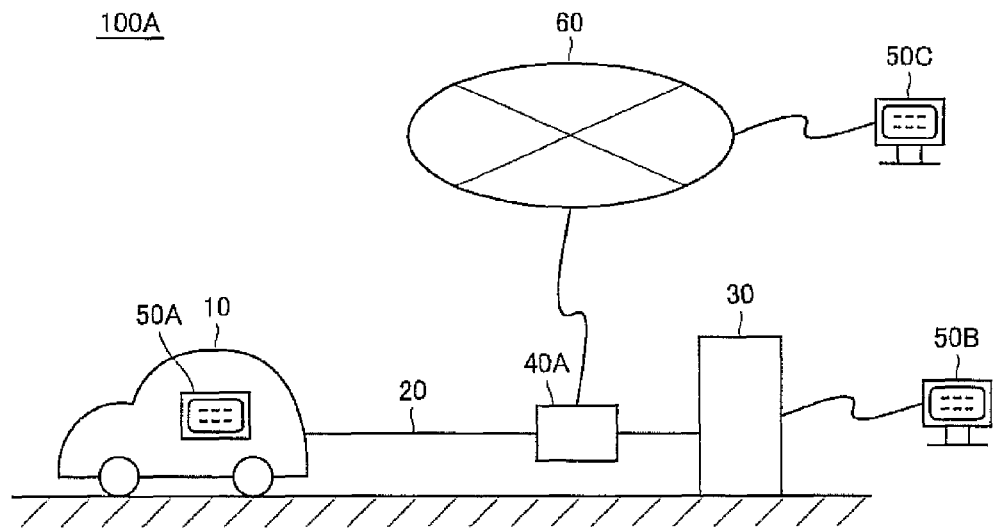
FIG. 20 is an illustration of the overall system for displaying degradation of power storage device in accordance with a modification of Embodiment 1.

FIG. 20 shows an overall system for displaying degradation of power storage device in accordance with a modification of Embodiment 1. Referring to FIG. 20, degradation display system 100A includes vehicle 10, power cable 20, power station 30, charging/discharging device 40A, display terminals 50A to 50C, and a data communication network 60.

Display terminal 50A is mounted on vehicle 10 and implemented, for example, by a car navigation device. Display terminal 50B is a display terminal for the dealer, connected, for example, to a power station 30 of the dealer. Display terminal 50C is a display terminal for the manufacturer and connected, for example, to a data communication network 60. Data communication network 60 is, for example, the Internet. Display terminal 50B for the dealer may be connected to data communication network 60.

Charging/discharging device 40A processes the data related to the state of degradation of power storage device to the first display item for the user of vehicle 10, the second display item for the dealer in charge of maintenance of vehicle 10, and the third display item for the manufacturer of vehicle 10. Charging/discharging device 40A transmits the processed display data through power cable 20 to display terminal 50A of vehicle 10. Further, when vehicle 10 is connected to power station 30 of the dealer, charging/discharging device 40A transmits the display data to display terminal 50B for the dealer connected to power station 30. Further, charging/discharging device 40A transmits the display data to display terminal 50C for the manufacturer, through data communication network 60.

It is noted that charging/discharging device 40A may transmit the first to third display data processed to the first to third display items to display terminals 50A to 50C, respectively. Other functions of charging/discharging device 40A are the same as those of charging/discharging device 40 in accordance with Embodiment 1.

Figure 21:
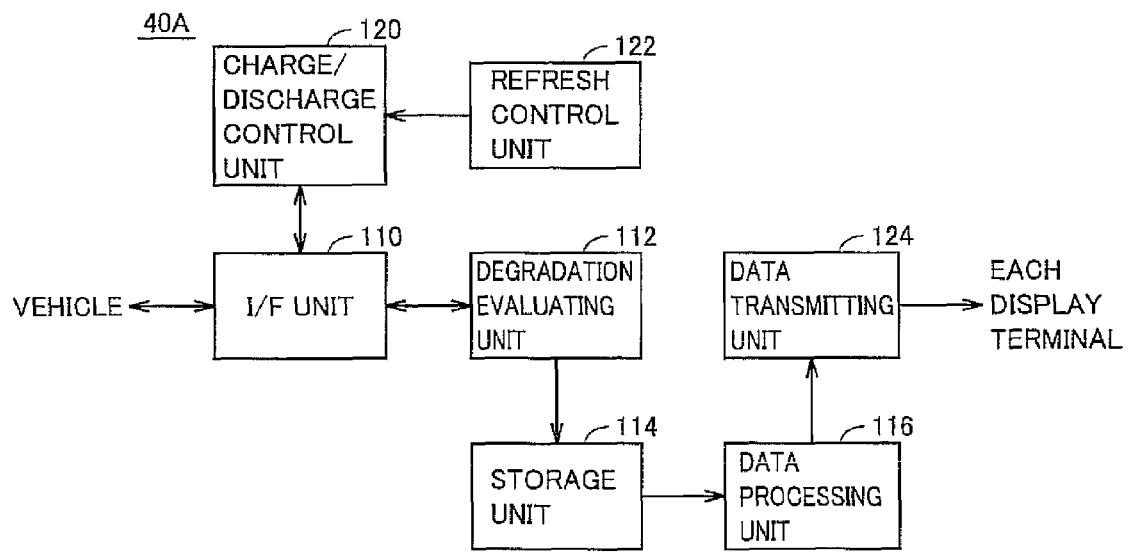
FIG. 21 is a functional block diagram of the charging/discharging device shown in FIG. 20.

FIG. 21 is a functional block diagram of charging/discharging device 40A shown in FIG. 20. Referring to FIG. 21, charging/discharging device 40A has the configuration of charging/discharging device 40 in accordance with Embodiment 1 shown in FIG. 2, and includes a data transmitting unit 124 in place of display control unit 118.

Data transmitting unit 124 receives from data processing unit 116 display data processed to each of the first to third display items by data processing unit 116, and transmits the received display data to each of display terminal 50A of vehicle 10, display terminal 50B of the dealer and display terminal 50C of the manufacturer.

As described above, data transmitting unit 124 may transmit the first to third display data processed to the first to third display items to display terminals 50A to 50C, respectively. Alternatively, upon reception of a data transmission request from display terminals 50A to 50C, data transmitting unit 124 may transmit all of the display data processed to first to third display items, or transmit the display data corresponding to the display terminal, to the display terminal that transmitted the transmission request.

[Embodiment 2]

In some regions, there are laws or regulations requiring lifetime guarantee of power storage devices for vehicle running, for example, of 10 years or 150,000 miles. It is expected that regions having such regulations increase along with wider use of electric powered vehicles mounting power storage devices for running. Therefore, in Embodiment 2, when the state of degradation of power storage device is displayed for the user of the vehicle, the lifetime guarantee specified by such law or regulation is also displayed.

Figure 22:
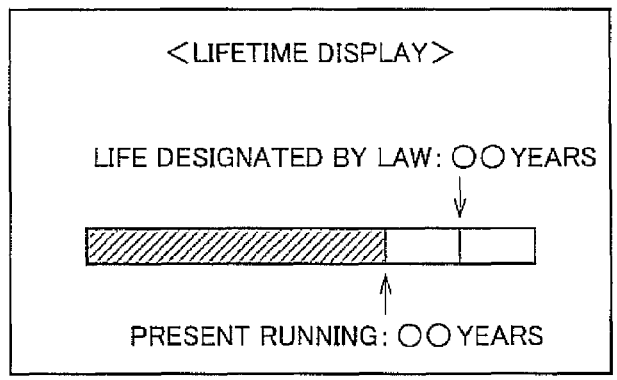
FIG. 22 shows an exemplary image of display of power storage device degradation in accordance with Embodiment 2.
Figure 23:
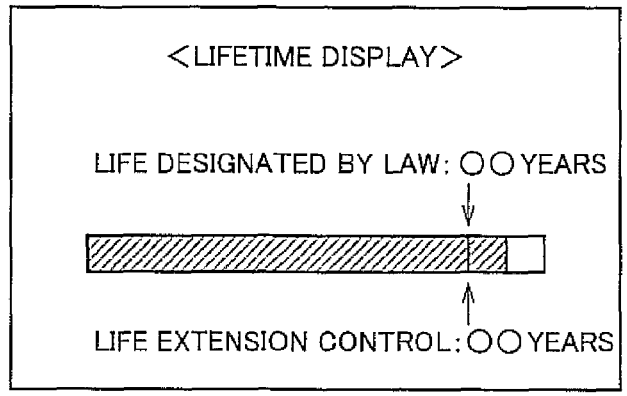
FIG. 23 shows an exemplary image of display of power storage device degradation in accordance with Embodiment 2.

FIGS. 22 and 23 show exemplary displays of degradation of power storage device in accordance with Embodiment 2. Referring to FIG. 22, the image displays the lifetime guarantee value (designated by law) of the power storage device designated by law, and the life (current running) of the power storage device at the present time point. The life at the present time indicates expected life of the power storage device at present evaluated by degradation evaluating unit 112. FIG. 22 shows that the life would be shorter than the guaranteed value.

In such a case, a life-extension control for making longer the life of power storage device is performed in Embodiment 2. By way of example, the power input to/output from the power storage device is limited, or charging time or amount for charging the power storage device of vehicle 10 from power station 30 is limited. FIG. 23 shows that by the life-extension control, the life of power storage device can be made longer than the guaranteed value.

Figure 24:
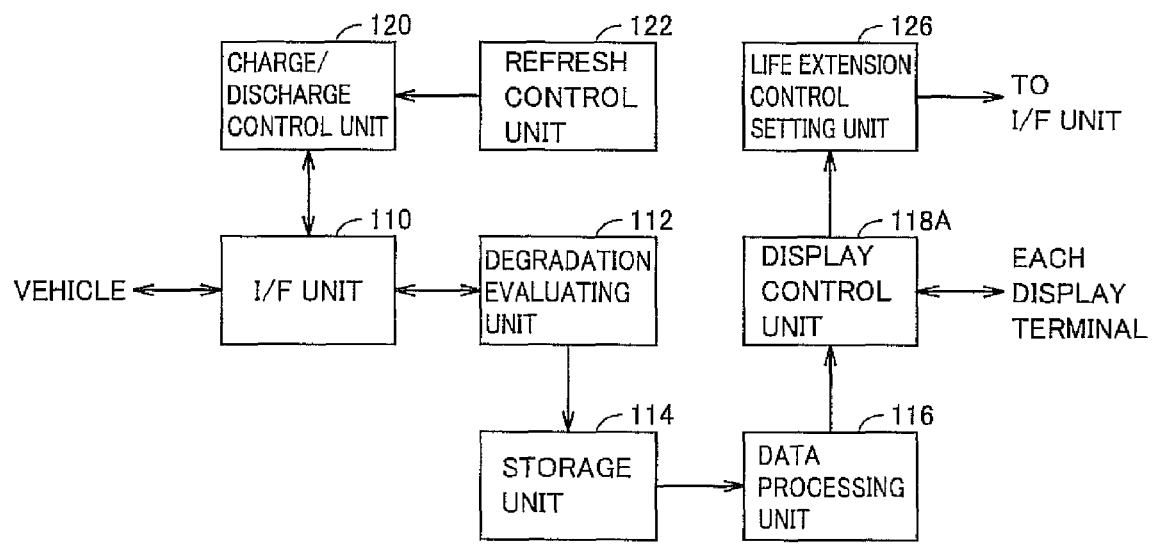
FIG. 24 is a functional block diagram of the charging/discharging device in accordance with Embodiment 2.

FIG. 24 is a functional block diagram of the charging/discharging device in accordance with Embodiment 2. Referring to FIG. 24, charging/discharging device 40B has the configuration of charging/discharging device 40 in accordance with Embodiment 1, and additionally includes life-extension control setting unit 126, and includes a display control unit 118A in place of display control unit 118.

Receiving display data processed to the first display item for the user from data processing unit 116, display control unit 118A outputs, together with the display data processed to the first display item for the user, a lifetime guarantee value of the power storage device designated by law, to display terminal 50. Then, as shown in FIG. 22 or 23, the life of power storage device and the lifetime guarantee value designated by law are displayed to the user, on the degradation display image for the user.

The lifetime guarantee value may be installed beforehand in a car navigation device or the like, or it may be downloaded from the Internet, for example, using a communication device. The lifetime guarantee value designated by law may be displayed on the display images for the dealer and the manufacturer.

If the life of power storage device evaluated by degradation evaluating unit 112 is shorter than the lifetime guarantee value of the power storage device designated by law, display control unit 118A outputs a command instructing execution of life-extension control of power storage device to life-extension control setting unit 126.

Receiving the command from display control unit 118A, life-extension control setting unit 126 sets a parameter for executing the life-extension control of power storage device in vehicle 10, and outputs the set parameter to vehicle 10 through I/F unit 110. By way of example, life-extension control setting unit 126 sets a parameter for limiting power input to/output from power storage device, or to limit the time or amount of charging when the power storage device of vehicle 10 is charged from power station 30. The parameter may not be set by life-extension control setting unit 126, and only a notice may be issued from life-extension control setting unit 126 to vehicle 10, with the parameter set on the side of vehicle 10.

Other functions of charging/discharging device 40B are the same as those of charging/discharging device 40 in accordance with Embodiment 1 shown in FIG. 2.

FIG. 25 is a flowchart representing the process related to the display of degradation of power storage device by charging/discharging device 40B in accordance with Embodiment 2. Referring to FIG. 25, the flowchart corresponds to the flowchart shown in FIG. 3, includes step S85 in place of step S80, and additionally includes steps S100 to S120.

Specifically, after the data obtained from storage unit 114 are processed by data processing unit 116 at steps S50 to S70, display control unit 118A outputs the processed display data and the lifetime guarantee value of the power storage device designated by law to display terminal 50 (step S85).

Next, display control unit 118A determines whether the life evaluated for the power storage device is shorter than the lifetime guarantee value designated by law (step S100). If the life is determined to be shorter than the guaranteed value designated by law (YES at step S100), a notice is issued from display control unit 118A to display terminal 50, and execution of the life-extension control for power storage device is notified by display terminal 50 (step S110). Thereafter, life-extension control setting unit 126 sets the parameter for actually executing the life-extension control of power storage device in vehicle 10, in vehicle 10 (step S120).

As described above, in Embodiment 2, the life representing the state of degradation of power storage device and the lifetime guarantee value of the power storage device as designated by law are displayed. Therefore, according to Embodiment 2, it is possible to grasp the state of degradation of power storage device in comparison with the statutory guaranteed value.

Further, according to Embodiment 2, if the life of power storage device is evaluated to be shorter than the guaranteed value designated by law, life extension control of the power storage device is executed. Therefore, according to Embodiment 2, it is possible to elongate the life of power storage device, by changing the manner of use that makes shorter the life of power storage device than the guaranteed value designated by law.

In each of the embodiments described above, vehicle 10 uses AC/DC converter 264 for power exchange between power station 30 and power storage device B of vehicle 10. A dedicated converter, however, is not always necessary. By connecting power lines ACL1 and ACL2 to neutral points of motor generators MG1 and MG2, respectively, and by adjusting voltage between the neutral points using inverters 258 and 260, it is possible to exchange power between power station 30 and the power storage device of vehicle 10.

In the foregoing, charging/discharging device 40 provided on power cable 20 evaluates the state of degradation of power storage device, and the evaluated state of degradation is processed to display data. It is also possible, however, to evaluate the state of degradation of power storage device by vehicle 10, and data processing may be done on the side of vehicle 10.

In the foregoing, vehicle 10 is capable of exchanging power to/from power station 30 outside of the vehicle. The scope of application of the present invention is not limited to a vehicle that can exchange power to/from the outside of the vehicle. In a vehicle not having the function of exchanging power to/from the outside of the vehicle, the degradation evaluation unit and the data processing unit described above may be provided in the vehicle.

In the foregoing, vehicle 10 is described as a hybrid vehicle having an engine and motor generators mounted as running power sources. Application of the present invention, however, is not limited to a hybrid vehicle and it may be applied to an electric vehicle not having an engine and a fuel cell vehicle having a fuel cell mounted as a DC power source.

In the foregoing, display terminals 50 and 50A to 50C correspond to the "display unit" of the present invention.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A displaying system for displaying information related to state of degradation evaluated for a power storage device for running mounted on a vehicle, comprising:
    a data processing unit for processing said information related to the state of degradation to a first display item for a user of said vehicle, a second display item for a dealer in charge of maintenance of said vehicle, and a third display item for a manufacturer of said vehicle; and
    a display unit for displaying said information processed by said data processing unit to said first to third display items, to said user, said dealer and said manufacturer, wherein
    said display unit is configured such that said user can select one of time display of displaying said information processed by said data processing unit in terms of time of use of said power storage device and distance display of displaying said information processed by said data processing unit in terms of running distance of said vehicle,
    said first display item includes information related to life of said power storage device,
    said second display item includes information related to state of malfunction occurrence of said power storage device, and
    said third display item includes information indicating expected degradation of said power storage device analyzed in advance, and information indicating actual degradation evaluated based on actual use of said power storage device.

2. The displaying system according to claim 1, wherein
    said information related to life of said power storage device includes information related to lifetime guarantee designated by law in a region where said vehicle is used, and information related to life evaluated based on actual use of said power storage device.

3. The displaying system according to claim 1, further comprising
    a display control unit for switching said information to be displayed on said display unit to any of said first to third display items in accordance with a request from a user of said display unit.

4. The displaying system according to claim 1, wherein
    said display unit is configured to be capable of further displaying improvement information urging said user to change a manner of use of said vehicle for improving life of said power storage device.

5. A method for displaying information related to state of degradation evaluated for a power storage device for running mounted on a vehicle, comprising the steps of:
    processing said information related to the state of degradation to a first display item for a user of said vehicle, a second display item for a dealer in charge of maintenance of said vehicle, and a third display item for a manufacturer of said vehicle; and
    displaying said information processed to said first to third display items, to said user, said dealer and said manufacturer, wherein
    said displaying step includes the steps of
        displaying said information processed in said processing step in terms of time of use of said power storage device, and
        as an alternative to display in terms of said time of use, displaying said information processed in said processing step in terms of running distance of said vehicle,
    said first display item includes information related to life of said power storage device,
    said second display item includes information related to state of malfunction occurrence of said power storage device, and
    said third display item includes information indicating expected degradation of said power storage device analyzed in advance, and information indicating actual degradation evaluated based on actual use of said power storage device.

6. The method according to claim 5, wherein
    said information related to life of said power storage device includes information related to lifetime guarantee designated by law in a region where said vehicle is used, and information related to life evaluated based on actual use of said power storage device.

7. The method according to claim 5, further comprising the step of
    switching, in accordance with a request from a user who uses said information related to state of degradation, said information to be displayed to said user to any of said first to third display items.

8. The method according to claim 5, further comprising the step of
    displaying improvement information urging said user to change a manner of use of said vehicle for improving life of said power storage device.

* * * * *